United States Patent [19]

Yu

[11] Patent Number: 5,353,863

[45] Date of Patent: Oct. 11, 1994

[54] PENTIUM CPU COOLING DEVICE

[76] Inventor: Chi T. Yu, 9F-1, No. 1, Lane 115, Sec. 3, Ming Chuan E. Rd., Taipei, Taiwan

[21] Appl. No.: 206,941

[22] Filed: Mar. 7, 1994

[51] Int. Cl.⁵ .......................................... H01L 23/467
[52] U.S. Cl. .................................. 165/80.3; 165/121; 361/691; 361/695; 361/696; 361/697
[58] Field of Search ............... 165/121, 122, 80.2, 165/80.3; 361/695, 696, 703, 709, 694, 691, 697

[56] References Cited

U.S. PATENT DOCUMENTS

| | | | |
|---|---|---|---|
| 3,149,666 | 9/1964 | Coe | 361/697 |
| 3,277,346 | 10/1966 | McAdam et al. | 361/697 |
| 4,594,643 | 6/1986 | Hermann | 361/703 |
| 5,282,364 | 2/1994 | Cech | 165/80.3 |

Primary Examiner—Albert W. Davis, Jr.
Attorney, Agent, or Firm—Browdy and Neimark

[57] ABSTRACT

A pentium CPU cooling device includes a radiating flange made of radiated structure and mounted on the CPU of the mainframe of a computer system by clamping plates for sending out heat from the CPU radially toward the top, an electric fan fastened to the radiating flange by screws and controlled to cause currents of air for carrying heat away from the radiating flange.

2 Claims, 5 Drawing Sheets

PENTIUM CPU COOLING DEVICE

BACKGROUND OF THE INVENTION

The present invention relates to a pentium CPU cooling device which effectively carries heat away from the CPU of a computer system by means of a radiating flange and an electric fan.

During the operation of the CPU of a computer system, a big amount of heat is produced. Heat must be quickly carried away during the operation of the CPU so as to prevent the component parts of the internal electronic circuit of the computer system from being damaged. Radiating flanges and electric fans are commonly used to carry heat away from the CPU. The most commonly employed method to carry heat away from the CPU of a computer system is to mount a radiating flange on the CPU and an electric fan above the radiating flange. However, this arrangement cannot satisfactorily carry heat away from the case of the mainframe of the computer system.

SUMMARY OF THE INVENTION

It is one object of the present invention to provide a pentium CPU mounting device which quickly carries heat from the CPU out of the mainframe of the computer system. It is another object of the present invention to provide a pentium CPU mounting device which is easy to install and inexpensive to manufacture.

According to one aspect of the present invention, the pentium CPU cooling device includes a radiating flange made of radiated structure and mounted on the CPU of the mainframe of a computer system for sending out heat from the CPU radially toward the top, and an electric fan fastened to the radiating flange by screws and controlled to cause currents of air for carrying heat away from the radiating flange.

According to another aspect of the present invention, clamping plates are provided to fasten the radiating flange to the CPU, wherein each clamping plate comprises a hooked portion at one end hooked in a respective groove at either side of the radiating flange, a flat mounting portion fastened to a respective mounting portion at either side of the radiating flange by a screw, and a clamping tail clamped on the CPU at either side.

DETAILED DESCRIPTION OF THE PREFERRED EMBODIMENT

Figure 1:
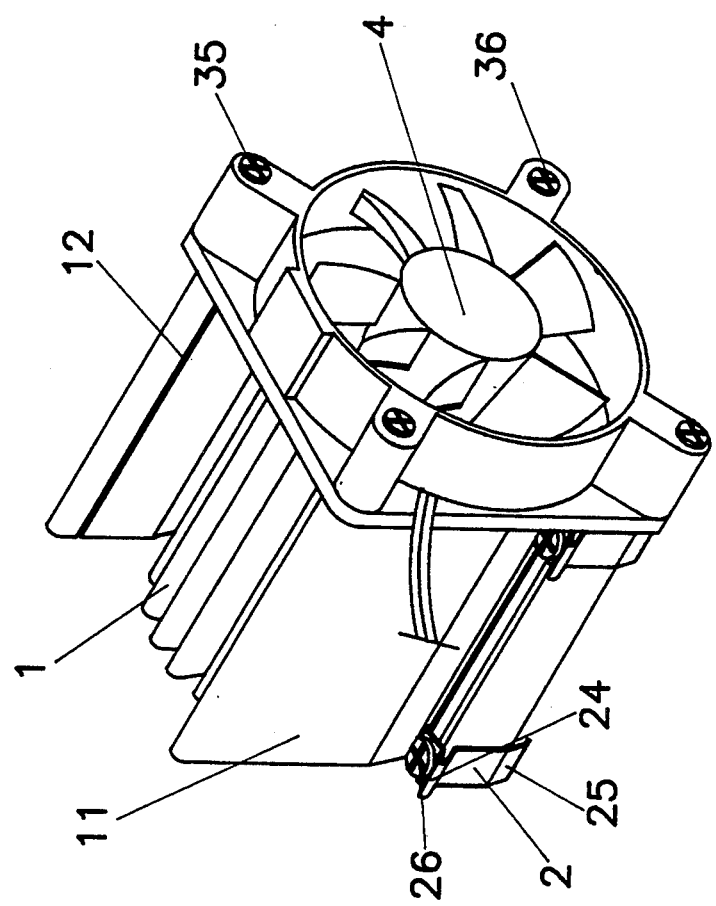
FIG. 1 is an elevational view of a pentium CPU cooling device according to the preferred embodiment of the present invention.
Figure 2:
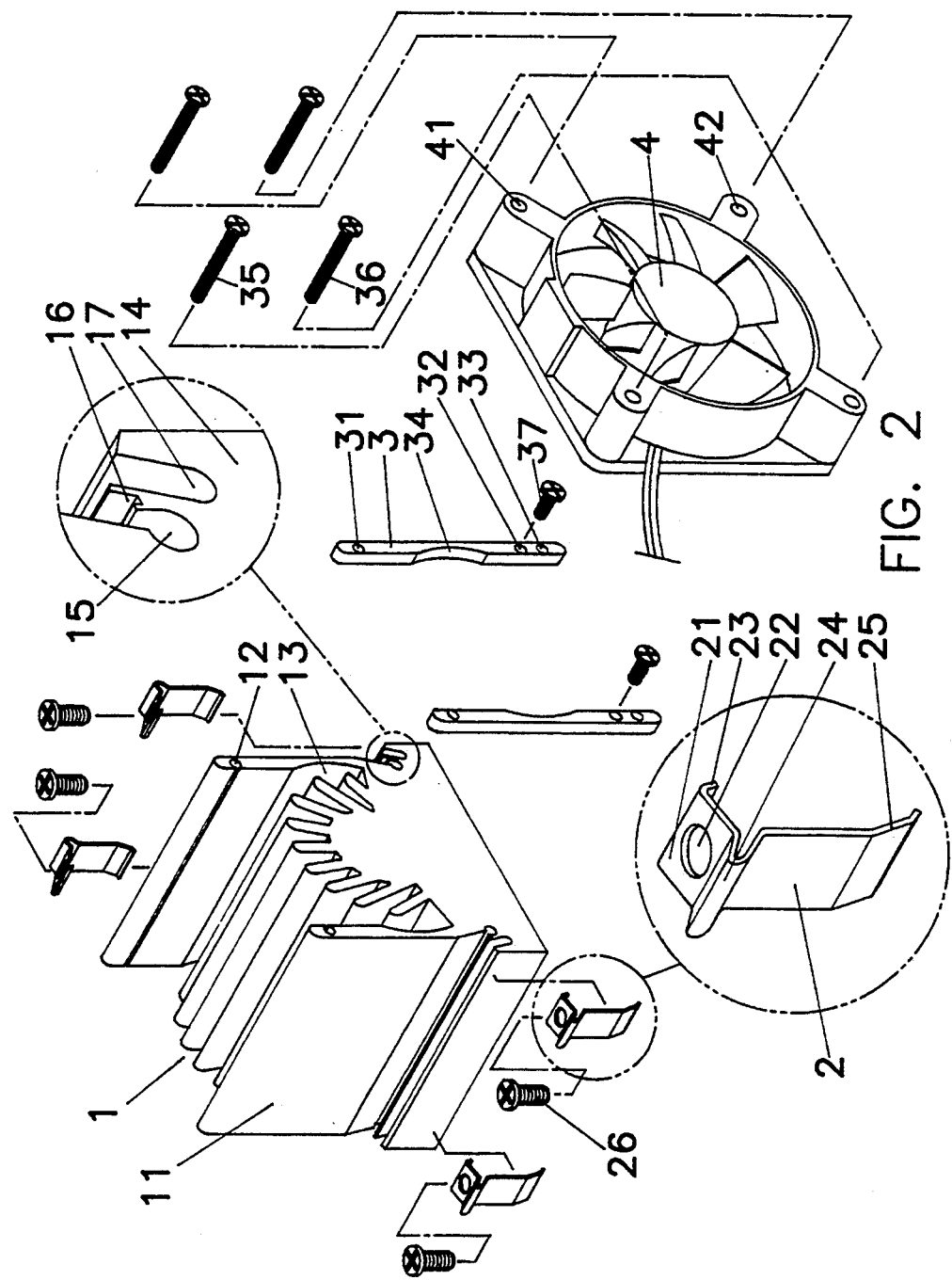
FIG. 2 is an exploded view of the pentium CPU cooling device shown in FIG. 1.

Referring to FIGS. 1 and 2, a pentium CPU cooling device in accordance with the present invention is generally comprised of a radiating flange 1, a plurality of clamping plates 2, two locating strips 3, and an electric fan 4.

The radiating flange 1 is made of radiated structure for sending out heat radially toward the top permitting heat to be carried away by the currents of air being caused by the electric fan 4. The radiating flange 1 comprises two upward extension walls 11 longitudinally and vertically disposed at two opposite sides and having a respective screw hole 12 longitudinally disposed at one end, two curved chambers 13 longitudinally disposed at two opposite sides within the upward extension walls 11, and two mounting portions 14 longitudinally and symmetrically disposed at two opposite sides, wherein each mounting portion 14 comprises an inner longitudinal groove 15 disposed at an inner side near the root of either upward extension wall 11, an outer longitudinal groove 17 disposed at an outer side, and an intermediate longitudinal groove 16 spaced between the inner longitudinal groove 15 and the outer longitudinal groove 17. The clamping plate 2 comprises a hooked portion 23 at one end, a turn 24 in the middle, a flat mounting portion 21 connected between the hooked portion and the turn 24, a center through hole 22 on the flat mounting portion 21, and a clamping tail 25 extended from the turn 24 at an opposite end. The locating strip 3 comprises a first mounting hole 31 at one end, a second mounting hole 32 and a third mounting hole 33 spaced at an opposite end, and an arched notch 34 spaced between the first mounting hole 31 and the second mounting hole 32 at one side. The electric fan 4 comprises two first mounting holes 41 bilaterally disposed at the top, and two second mounting holes 42 bilaterally disposed at the bottom.

Figure 3:
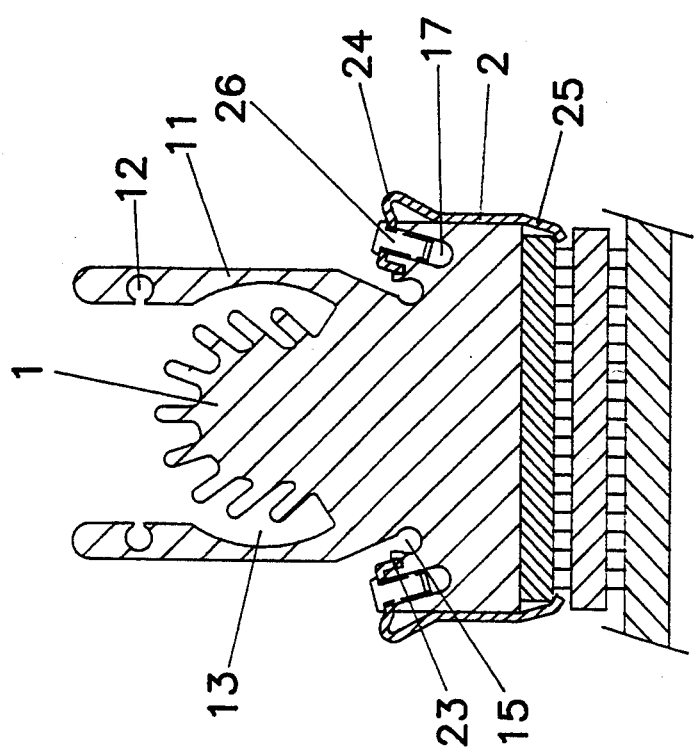
FIG. 3 is a sectional view of the pentium CPU cooling device shown in FIG. 1.

Referring to FIG. 3 and FIGS. 1 and 2 again, the second mounting hole 32 of the locating strip 3 is fastened to the inner longitudinal groove 15 of either mounting portion 14 of the radiating flange 1 at one end by a screw 37; the first mounting hole 31 of the locating strip 3 is fastened between either first mounting hole 41 of the electric fan 4 and the screw hole 12 on either upward extension wall 11 of the radiating flange 1 by a screw 35; the second mounting holes 42 of the electric fan 4 are respectively fastened to the third mounting hole 33 of either locating strip 3 by a respective screw 26. When the radiating flange 1, the locating strips 3, and the electric fan 4 are fastened together, the radiating flange 1 is then fastened to the CPU by the clamping plates 2. The mounting procedure of the clamping plate 2 is easy and outlined hereinafter. The hooked portion 23 is hooked in the intermediate longitudinal groove 16 on either mounting portion 14 of the radiating flange 1, then the flat mounting portion 21 is fastened to the respective mounting portion of the radiating flange 1 by threading a screw 26 through the center through hole 22 into the outer longitudinal groove 17 on the respective mounting portion 14 of the radiating flange 1. When the clamping plate 2 is fastened to the radiating flange 1, the clamping tail 25 is clamped at one side of the shell of the CPU. When assembled, the arched notch 34 of the locating strip 3 fits over the periphery of either curved chamber 13 at an outer side so that currents of air from the electric fan 4 can pass through the curved chambers 13 to carry heat away from the radiating flange 1.

Figure 4:
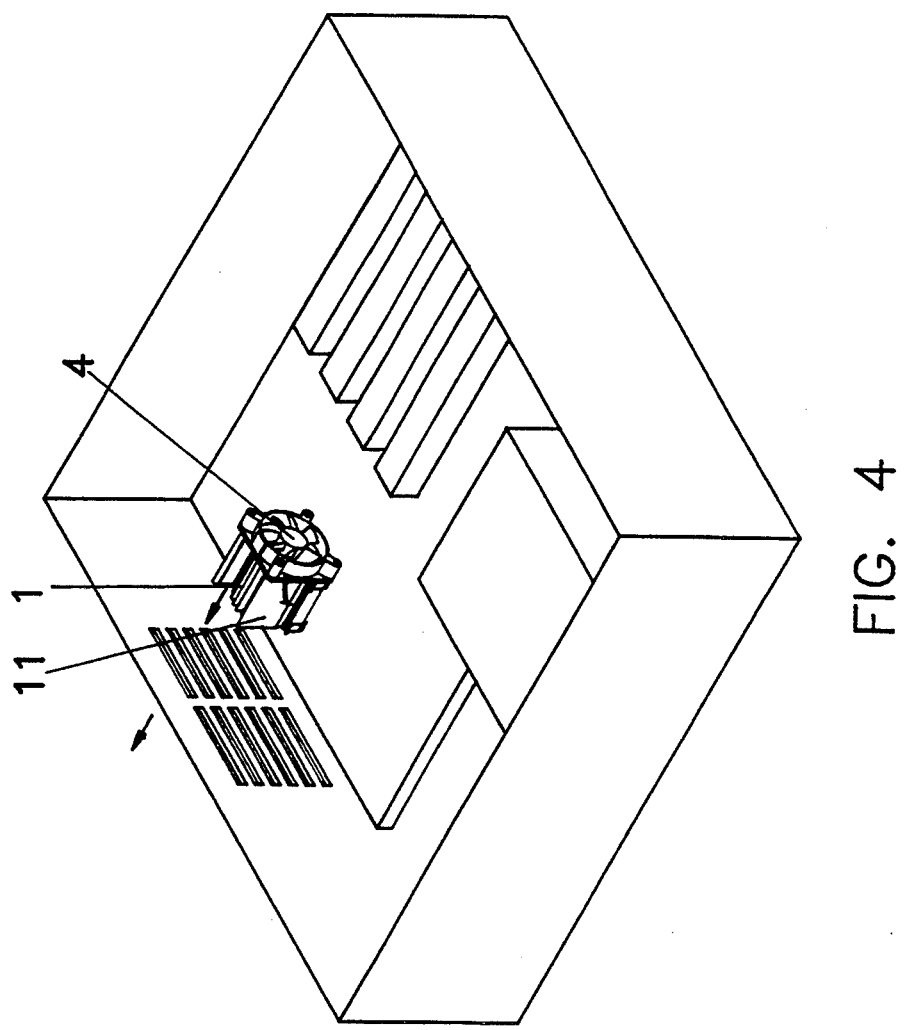
FIG. 4 is an installed view showing the pentium CPU cooling device of FIG. 1 installed in the mainframe of a personal computer.

FIG. 4 shows the pentium CPU cooling device installed in the CPU inside the mainframe of a personal computer. During the operation of the CPU, heat from the CPU is transmitted radially into the air through the radiating flange 1 and then carried out of the mainframe of the personal computer by the currents of air being caused by the electric fan.

Figure 5:
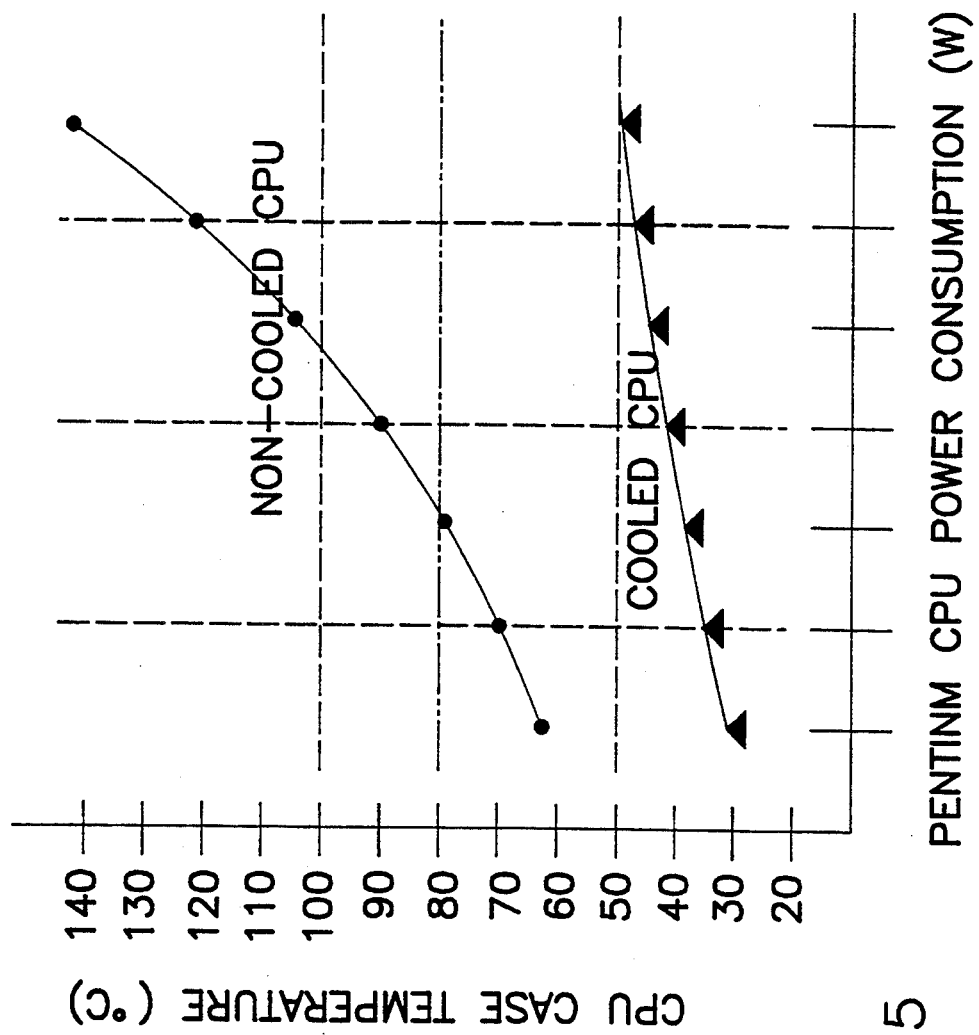
FIG. 5 is a chart showing heat dissipating curves on cooled CPU and non-cooled CPU according to the present invention.

Referring to FIG. 5, the operation of the pentium CPU cooling device of the present invention greatly reduces CPU case temperature.

While only one embodiment of the present invention has been shown and described, it will be understood that various modifications and changes could be made without departing from the spirit and scope of the invention.

What is claimed is:

1. A pentium CPU cooling device comprising:

a radiating flange mounted on the CPU of a computer system to dissipate heat from the CPU, said radiating flange comprising two upward extension walls longitudinally and vertically disposed at two opposite sides and having a respective screw hole longitudinally disposed at one end, two curved chambers longitudinally disposed at two opposite sides within the upward extension walls, and two mounting portions longitudinally and symmetrically disposed at two opposite sides, each mounting portion of said radiating flange comprising an inner longitudinal groove disposed at an inner side near the root of either upward extension wall, an outer longitudinal groove disposed at an outer side, and an intermediate longitudinal groove spaced between said inner longitudinal groove and said outer longitudinal groove;

a plurality of clamping plates to fasten said radiating flange to said CPU, each clamping plate comprising a hooked portion at one end hooked in the intermediate longitudinal groove on either mounting portion of said radiating flange, a turn in the middle, a flat mounting portion connected between said hooked portion and said turn and covered on the respective mounting portion of said radiating flange at the top, a center through hole on the flat mounting portion of the respective clamping plate through which a screw is threaded into the outer longitudinal groove of the respective mounting portion of said radiating flange to hold down the flat mounting portion of the respective clamping plate, and a clamping tail extended from said turn at an opposite end and clamped on said CPU at one side;

two locating strips respectively connected to the two upward extension walls of said radiating flange at one end, each locating strip comprising a first mounting hole at one end fastened to the screw hole on either upward extension wall by a screw, a second mounting hole spaced from said first mounting hole and fastened to the inner longitudinal groove of either mounting portion of said radiating flange by a screw, a third mounting hole at an opposite end, and an arched notch spaced between said first and second mounting holes and fitting over the periphery of either curved chamber of said radiating flange at an outer side for permitting currents of air to pass; and an electric fan controlled to cause currents of air in carrying heat away from said radiating flange and said CPU, said electric fan comprising two first mounting holes bilaterally disposed at the top and respectively fastened to the first mounting hole of either locating strip and the screw hole of either upward extension wall, and two second mounting holes bilaterally disposed at the bottom and respectively fastened to the third mounting hole of either locating strip by a respective screw.

2. The pentium CPU cooling device of claim 1 wherein said radiating flange is made of radiated structure for sending out heat radially toward the top permitting heat to be carried away by the currents of air being caused by said electric fan.

* * * * *